(12) United States Patent
Weber

(10) Patent No.: US 12,185,516 B1
(45) Date of Patent: Dec. 31, 2024

(54) APPARATUSES, SYSTEMS, AND METHODS FOR PROTECTION AGAINST THE EFFECTS OF AN ELECTROMAGNETIC PULSE

(71) Applicant: Jacob C. Weber, Nashville, TN (US)

(72) Inventor: Jacob C. Weber, Nashville, TN (US)

( * ) Notice: Subject to any disclaimer, the term of this patent is extended or adjusted under 35 U.S.C. 154(b) by 567 days.

(21) Appl. No.: 17/466,505

(22) Filed: Sep. 3, 2021

Related U.S. Application Data

(60) Provisional application No. 63/074,080, filed on Sep. 3, 2020.

(51) Int. Cl.
| | | |
|---|---|---|
| *H05K 9/00* | (2006.01) | |
| *H01Q 1/00* | (2006.01) | |
| *H01R 13/658* | (2011.01) | |

(52) U.S. Cl.
CPC ........... *H05K 9/0066* (2013.01); *H01Q 1/002* (2013.01); *H01R 13/658* (2013.01); *H05K 9/006* (2013.01); *H05K 9/0086* (2013.01); *H05K 9/0049* (2013.01)

(58) Field of Classification Search
CPC .... H05K 9/0049; H05K 9/006; H05K 9/0066; H05K 9/0086; H01Q 1/002; H01R 13/658
USPC .................................................. 361/118, 119
See application file for complete search history.

(56) References Cited

U.S. PATENT DOCUMENTS

| | | | | |
|---|---|---|---|---|
| 5,122,921 A | * | 6/1992 | Koss ....................... | H02H 9/005 361/111 |
| 5,180,314 A | * | 1/1993 | Gelin ................... | H05K 9/0018 439/579 |
| 5,896,265 A | * | 4/1999 | Glaser ..................... | H01Q 1/50 361/111 |
| 11,290,143 B1 | * | 3/2022 | Sternowski .......... | H05K 9/0081 |
| 2011/0080683 A1 | * | 4/2011 | Jones ....................... | H01Q 1/50 361/119 |
| 2015/0077889 A1 | * | 3/2015 | Kauffman .............. | H03H 7/075 361/56 |
| 2016/0205814 A1 | * | 7/2016 | Burke .................... | H05K 9/006 174/377 |
| 2022/0302948 A1 | * | 9/2022 | Sternowski .............. | H02H 9/04 |

FOREIGN PATENT DOCUMENTS

KR 102311307 B1 * 10/2021

* cited by examiner

*Primary Examiner* — Jared Fureman
*Assistant Examiner* — Nicolas Bellido
(74) *Attorney, Agent, or Firm* — Patterson Intellectual Property Law, P.C.; Seth R. Ogden; Samuel A. Raque

(57) ABSTRACT

Apparatuses, systems, and methods for protection against the effects of an electromagnetic pulse (EMP). A system for protecting against an EMP may include an electronic device, a conductive element, and a connector apparatus coupleable between the electronic device and the conductive element. The conductive element may include a housing having a first end and a second end, the first end coupleable to the electronic device and the second end coupleable to the conductive element, a signal wire extending at least partially through the housing which conveys at least one signal between the first end and the second end, a grounding wire coupleable to the signal wire, and at least one suppression element coupleable to at least one of the signal wire and the grounding wire. A casing may receive at least a portion of the electronic device.

19 Claims, 3 Drawing Sheets

APPARATUSES, SYSTEMS, AND METHODS FOR PROTECTION AGAINST THE EFFECTS OF AN ELECTROMAGNETIC PULSE

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of U.S. Provisional Patent Application No. 63/074,080, filed Sep. 3, 2020, entitled "Apparatuses, Systems, and Methods for Protection Against the Effects of an Electromagnetic Pulse," and which is hereby incorporated by reference in its entirety.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND

Numerous problems exist in the art in relation to electromagnetic pulses (EMP) and the damage they can cause to electronic devices and electronic communications. EMPs can be caused by man-made or natural forces, such as lightning, power line surges, coronal mass ejection events, nuclear explosions, or other event or entity. EMPs can damage or disable electronic devices or components thereof, for example by inducing a current in conductive elements which can damage physical components. Existing solutions to prevent EMP damage to electronic devices or communications are often expensive and bulky, are often designed only for a single device or device type which do not provide ease and simplicity of use. Furthermore, existing solutions do not do a good job of protecting electronic device elements coupled to one another, such as a radio to an antenna or remote microphone.

Accordingly, what is needed is a solution to provide protection from EMPs that is low cost, easily implemented, and/or compatible across an array of devices or elements.

BRIEF SUMMARY

Embodiments of the present disclosure provide apparatuses, systems, and methods for protection against the effects of an electromagnetic pulse (EMP).

Aspects of implementations consistent with the present disclosure may allow handheld radios the ability to communicate without fear of being short-circuited via an EMP. Radios that are currently not hardened against said threat may be protected according to aspects of the present disclosure. One or more EMPs which may destroy circuitry have a high possibility of being utilized if war occurs against nuclear capable nations. Use of apparatuses, systems, and methods consistent with the present disclosure may allow communication systems to survive such EMP attack. Implementations consistent with the present disclosure are substantially simpler in design and operation and may be implemented at significantly lower cost than internally hardened electronic device designs and builds. Furthermore, implementations consistent with the present disclosure provide a wide range of use across devices rather than internally hardened electronic devices which are necessarily one-off designs and implementations.

Implementations consistent with the present disclosure may include an adapter configured to couple an electronic device to an external electronic element or communication element, such as an antenna or remote microphone, to protect one or more of the electronic device, the external electronic element, and/or the communication element.

Further embodiments may include a casing configured to surround at least a portion of an electronic device to protect the device against the effect of one or more EMPs.

According to aspects of the present disclosure, provided is a connector apparatus for coupling an electronic device and a conductive element and protecting against an EMP. The connector apparatus includes a housing having a first end and a second end, the first end coupleable to the electronic device and the second end coupleable to the conductive element, a signal wire extending at least partially through the housing and configured to convey at least one signal between the first end and the second end, a grounding wire coupleable to the signal wire, and at least one suppression element coupleable to at least one of the signal wire and the grounding wire.

The at least one suppression element may be coupled between the signal wire and the grounding wire within the housing. The at least one suppression element comprises at least one metal oxide varistor (MOV). The connector apparatus may include a fuse coupleable to the signal wire within the housing. The connector apparatus may include a choke coil coupleable to the signal wire within the housing. The first end may include a coupler configured to connect to an antenna. The second end may include a coupler configured to connect to an electronic device.

According to further aspects of the present disclosure, provided is a system for protecting against an EMP. The system may include an electronic device, a conductive element, and a connector apparatus coupleable between the electronic device and the conductive element. The connector apparatus may include a housing having a first end and a second end, the first end coupleable to the electronic device and the second end coupleable to the conductive element, a signal wire extending at least partially through the housing and configured to convey at least one signal between the first end and the second end, a grounding wire coupleable to the signal wire, and at least one suppression element coupleable to at least one of the signal wire and the grounding wire. The system may further include a casing configured to receive at least a portion of the electronic device.

The casing may be a metal mesh material configured to form at least a portion of a Faraday cage around at least a portion of the electronic device. The metal mesh material may be aluminum. The at least one suppression element may be coupled between the signal wire and the grounding wire within the housing. The at least one suppression element may be at least one MOV. The connector apparatus may include a fuse coupleable to the signal wire within the housing. The connector apparatus may include a choke coil coupleable to the signal wire within the housing. The first end may include a coupler configured to connect to an antenna. The second end may include a coupler configured to connect to an electronic device.

According to further aspects of the present disclosure, provided is a method of protecting against an EMP, including receiving a signal at a conductive element coupled to a connector, passing the received signal through a plurality of components of the connector to remove one or more anomalies from the received signal caused by an EMP to form a protected signal, and providing the protected signal to an electronic device coupled to the connector. At least a portion of the electronic device may be placed within at least a portion of a casing such that the at least casing forms a Faraday cage around the at least a portion of the electronic device. Passing the received signal through the plurality of components of the connector may include passing at least a portion of the received signal through a signal wire within a housing of the connector, wherein at least one suppression element coupled to the signal wire provides surge protection to protect the electronic device from an EMP. The at least one suppression element may provide surge protection by conveying the one or more anomalies along the signal wire to a ground wire within the housing of the connector.

Additional aspects of the present disclosure may include a connector apparatus having a housing containing a live wire, a ground wire, a choke coil, a fuse, and at least one MOV, a first end coupleable to an electronic device, and a second end coupleable to a conductive element.

Further aspects of the present disclosure provide a system for protecting against an EMP. The system includes an electronic device, a conductive element, and a connector apparatus. The connector apparatus includes a housing containing a live wire, a ground wire, a choke coil, a fuse, and at least one MOV, a first end coupleable to the electronic device, and a second end coupleable to the conductive element. A casing may receive at least a portion of the electronic device and may function as Faraday cage for the received at least portion of the electronic device.

According to still further aspects of the present disclosure, provided is a method of protecting against an EMP. The method includes receiving a signal at a conductive element coupled to a connector, passing the received signal through a plurality of components of the connector to remove one or more anomalies from the received signal caused by an EMP to form a protected signal, and providing the protected signal to an electronic device coupled to the connector.

Numerous other objects, features, and advantages of the present disclosure will be readily apparent to those skilled in the art upon a reading of the following disclosure when taken in conjunction with the accompanying drawings.

DETAILED DESCRIPTION

Figure 1:
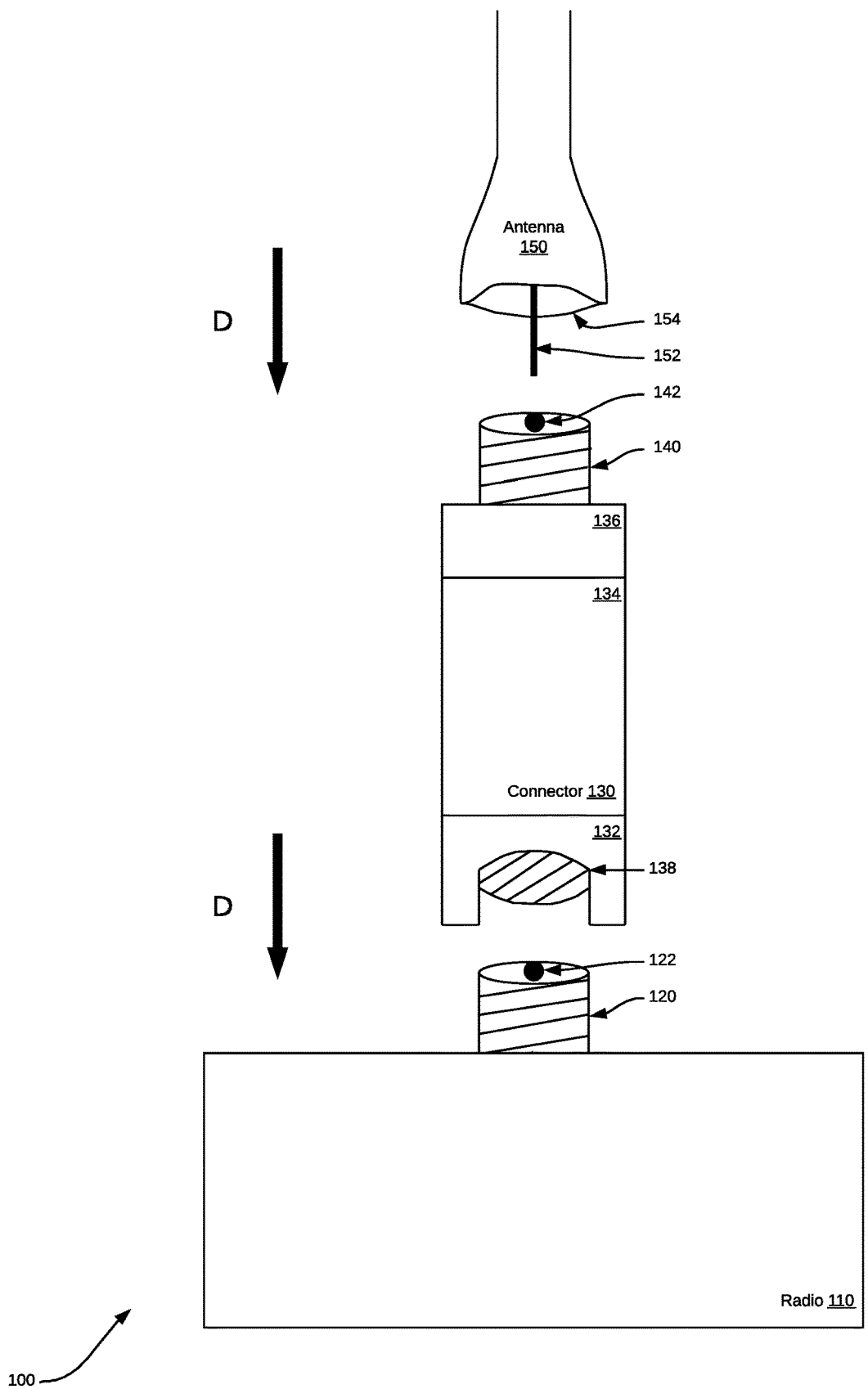
FIG. 1 illustrates an exemplary embodiment of a connector system according to aspects of the present disclosure.

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use implementations consistent with the present disclosure and do not delimit the scope of the invention.

Referring generally to FIGS. 1-3B, various exemplary apparatuses, systems, and associated methods according to the present disclosure are described in detail. Where the various figures may describe embodiments sharing various common elements and features with other embodiments, similar elements and features are given the same reference numerals and redundant description thereof may be omitted below.

Various embodiments of an apparatus according to the present disclosure may provide apparatuses, systems, and methods for automated question generation for documents.

FIG. 1 illustrates an exemplary embodiment of a connector system 100 according to aspects of the present disclosure. The system 100 includes an electronic device, such as a radio 110 having a coupler 120. The coupler 120 may have a receiving section 122 configured to receive at least one signal or portion thereof, for example from a connector 130. It should be appreciated that although being described as a radio 110, one or more electronic device consistent with the present disclosure may be any electronic device configured to receive at least one input (e.g., via the coupler 120). Although not illustrated, the radio 110 may include one or more electronic components therein or otherwise associated therewith. For example, the radio 110 may include a microprocessor coupleable to at least one storage and configured to perform at least one operation associated with the radio 110. The radio 110 may include a communication unit configured to transmit and/or receive at least one signal, for example via the coupler 120. The radio 110 may further include one or more interfaces (either physical or virtual) to permit local or remote control or operation of the radio 110. The one or more interfaces may be at least one button or visual display provided by or associated with the radio 110. The coupler 120 may utilize the same end design as one or more hand microphones and/or antennae (e.g., male and/or female end) to connect the protection system to one or more radios 110.

A connector 130 may be coupleable to the radio 110, for example at the coupler 120. At least a portion of the coupler 120 may be received within a portion of the connector 130, for example at a receiving portion 138 of a first end 132 of the connector 130. The connector 130 may include a body 134 housing at least one surge protection element (for example, as illustrated by and described herein with reference to FIG. 2A). The connector 130 may be coupleable to the radio 110 in a connection direction D, for example by rotating the connector 130 relative to the coupler 120, or any other means of physical or communicative coupling. The connector 130 may further include a coupler 140 at a second end 136 thereof. The coupler 140 of the second end 136 may be configured to couple with an external element, such as an antenna 150 in a connection direction D. Although described as an antenna, it should be appreciated that the antenna 150 may be any device that is communicatively coupleable to the connector 130 and may include one or more electronic devices or elements, such as an antenna, a conductive wire, a remote microphone device or communication element, or any other electronic device or element capable of being communicatively coupleable to the connector 130 and/or radio 110.

The coupler 140 may include a receiving section 142 configured to receive at least one signal or portion thereof, for example, to or from the antenna 150. The antenna 150 in various embodiments may include a conductive element 152 protruding from an opening 154 thereof, for example as a coaxial cable connection or the like. Additionally or alternatively the antenna 150 may be configured to couple with the connector 130 using any other physical or communicative connection or combination thereof without departing from the spirit and scope of the present disclosure. The coupler 140 may utilize the same end design as one or more hand microphones and/or antennae (e.g., male and/or female end) to connect the protection system to one or more radios 110.

Figure 2A:
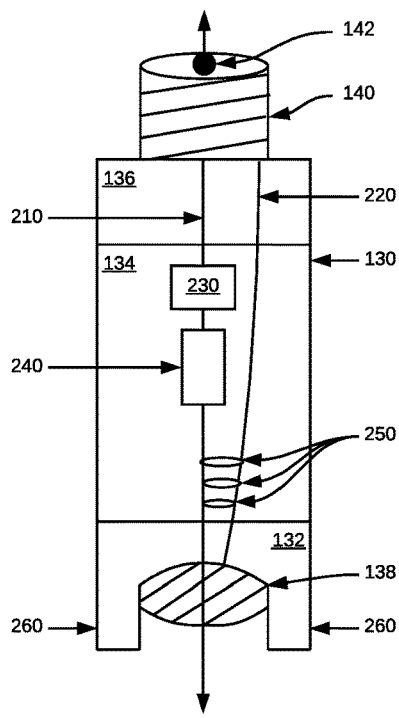
FIG. 2A illustrates an exemplary embodiment of a connector apparatus according to aspects of the present disclosure.

FIG. 2A illustrates an exemplary embodiment of a connector 130 according to aspects of the present disclosure. The connector 130 includes the first end 132, the body 134, and the second end 136 previously described above with reference to FIG. 1. One or more protection elements may be provided by or in conjunction with the connector 130. For example, the connector 130 may include a live wire 210 coupleable between the coupler 140 and the receiving portion 138. A choke coil 230 may be coupled to the live wire 210 between the first end 132 and the second end 136. A fuse 240 may be coupled to the live wire 210. Although illustrated as having a single choke coil 230 and fuse 240, it should be appreciated that the connector 130 may include two or more choke coils 230, fuses 240, or combination thereof in various embodiments. A grounding wire 220 may be coupled to the live wire 210 via one or more metal-oxide varistor(s) (MOVs) 250. One or more rubber flaps 260 may extend outwardly from the first end 132 and may be configured to surround at least a portion of the receiving portion 138.

The connector 130 of FIG. 2A may be coupled between the radio 110 and the antenna 150. For example, the first end 132 of the connector 130 may be coupled to the radio 110 and the second end 136 may be coupled to the antenna 150. In such configuration, the communication unit of the radio 110 may be capable of receiving one or more signals from an external source via reception at the antenna 150. Additionally or alternatively, the communication unit of the radio 110 may be configured to transmit at least one signal from the radio 110 via the antenna 150. When coupled between the radio 110 and the antenna 150, the connector 130 may provide at least one of surge protection or prevention associated with the radio 110 and/or antenna 150.

During operation, input receivable at the antenna 150 may be communicated along the live wire 210 to the choke coil 230. The choke coil 230 may be configured to remove at least one alternating current (AC) component of the input received at the coupler 140 from the antenna 150. After passing through the choke coil 230, the input may be received at the fuse 240. The fuse may be configured to break contact upon one or more voltage and/or current values received at the fuse 240. Although illustrated as a single fuse, it should be appreciated that two or more fuses 240 may be implemented, for example in series or in parallel according to one or more design or operation characteristic. In various embodiments, one or more characteristic of the connector 130 may be predetermined based at least in part upon one or more characteristics of the radio 110 and/or antenna 150. For example, a size, type, or rating of the choke coil 230 and/or fuse 240 may be predetermined based on a radio type or antenna type. Additionally or alternatively, at least one setting or operating parameter of the connector 130 may be selected or adjusted by a user of the connector 130, for example where a variable or adjustable element such as a choke coil, fuse or MOV 250 is used.

At least one MOV 250 may be coupled between the live wire 210 and the grounding wire 220. The MOV 250 may include a metal oxide material between two semiconductors, one associated with the live wire 210 and one associated with the grounding wire 220. The semiconductors may have variable resistance based upon voltage such that when a voltage exceeds a predetermined MOV voltage the resistance is reduced and current may flow across the MOV from the live wire 210 to the grounding wire 220. Unlike complete cut-off elements such as a fuse, the MOV 250 may be configured to permit signaling to/between the radio 110 and antenna 150, even in the event of an EMP, without damaging the radio 110 or antenna 150 once any excess current is diverted from the live wire 210 to the grounding wire 220. In embodiments having a plurality of MOVs 250, each MOV 250 may have a different operation parameter, or two or more of the MOVs 250 may have a same operation parameter.

Figure 2B:
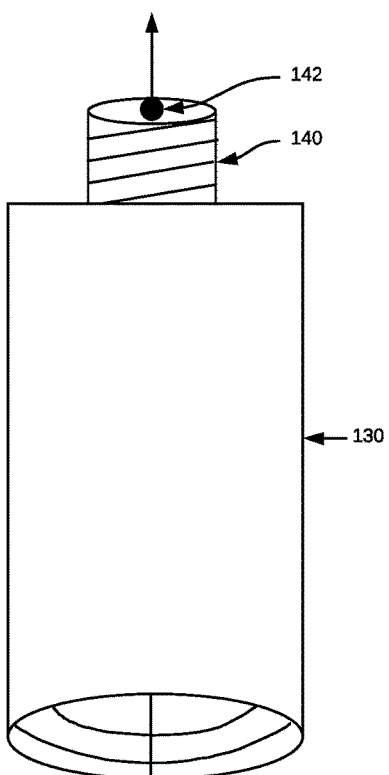
FIG. 2B illustrates an exemplary embodiment of a connector apparatus according to aspects of the present disclosure.

FIG. 2B illustrates an exemplary embodiment of a connector 130 according to aspects of the present disclosure. The connector 130 of FIG. 2B may contain one or more elements previously described herein with reference to FIG. 2A. connector 130 might not include one or more rubber flap 260.

Figure 3A:
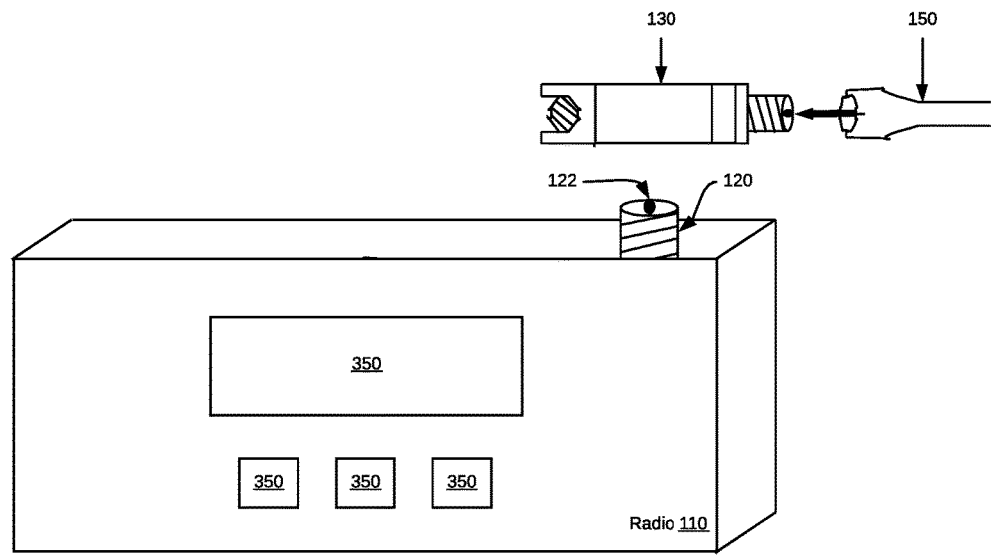
FIG. 3A illustrates an exemplary embodiment of a radio according to aspects of the present disclosure.

FIG. 3A illustrates an exemplary embodiment of a radio 110 according to aspects of the present disclosure. The radio 110 includes the coupler 120 having the receiving section 122 and one or more interfaces 350. The one or more interfaces 350 may include a visual display, one or more buttons or knobs for use of the radio, one or more control elements, or any other element which permits user interactivity and/or conveys information regarding an operation status of the radio 110. The connector 130 may be configured to couple to the radio 110, for example at the coupler 120 as previously described herein. The antenna 150 may be configured to couple to the connector 130 as previously described herein.

Figure 3B:
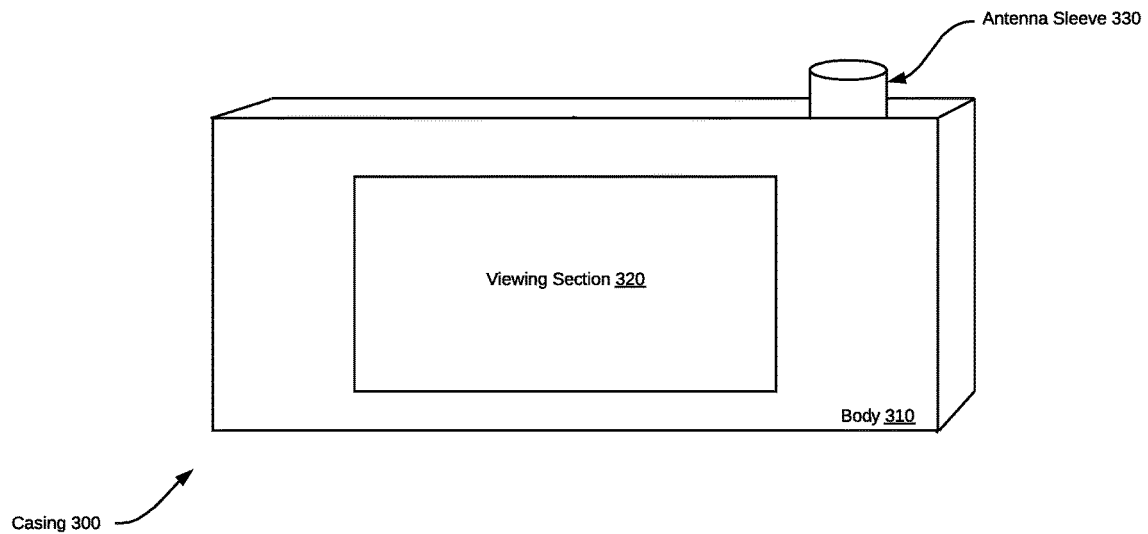
FIG. 3B illustrates an exemplary embodiment of a casing according to aspects of the present disclosure.

FIG. 3B illustrates an exemplary embodiment of a casing 300 according to aspects of the present disclosure. The casing 300 may be configured to cover at least a portion of the radio 110. In various embodiments, the casing 300 may be configured to enclose at least a portion of the radio 110 and may be configured to enclose the entire radio 110. The casing 300 may include a body 310 configured to cover at least a portion of a surface of the radio 110. At least a portion of the body 310 may be formed of a metal or metallic material, for example a woven metal material. By providing a metal or metallic enclosure, the body 310 may function as a Faraday cage to block electromagnetic signals from affecting the radio 110. The body 310 may include a viewing section 320 configured to permit a user to interact with an interface 350 of the radio 110. The viewing section 320 may be formed of a material sufficient to permit a user of the radio 110 to operate the radio 110 while the casing 300 functions as a Faraday cage to prevent damage to or effects upon the radio 110 by an EMP. Although described as a viewing section 320 it should be appreciated that the viewing section 320 or portion thereof may be transparent and/or opaque in various embodiments. In various embodiments at least a portion of the viewing section 320 is configured to be openable and/or removeable to permit access to an interior portion of the casing 300, for example to allow a user of the radio 110 to access the radio 110 or interface 350 thereof. Additionally or alternatively, at least a portion of the viewing section 320 may be formed of a fabric which is capable of permitting a user of the radio 110 to access and/or operate the radio 110 while the casing 300 is coupled to the radio 110.

In various exemplary embodiments, the at least a portion of the casing 300 may serve as a Faraday cage, for example being aligned with a metallic (e.g., aluminum or other metal or metal-containing) material. The material may be configured to form an aluminum mesh in various embodiments. The mesh may be configured to protect the body of the radio 110 and may be configured to extend beyond one or more protection attachments or connectors for an antenna and/or hand-microphone. The mesh may be configured to overlap in areas where there are flaps or other material such that a user may still operation the radio 110, for example programming the radio or inputting an operating frequency without requiring the radio 110 to be removed from the casing 300. In various embodiments, a casing 300 may be tailored depending upon at least one parameter of the radio 110, such as a size, one or more button positions of the radio 110, or any other parameter or characteristic associated with the radio 110 (or associated antenna or hand-microphone or the casing 300 itself).

The body 310 may include an opening (not illustrated) of a size and shape sufficient to permit at least a portion of the radio 110 to be received within the casing 300. One or more fastening elements, such as a fold, a hook-and-loop connector, a zipper, a button, a magnetic coupler, or any other fastener may be used to secure an openable section or element of the body 310 of the casing 300. The fastener may be of a type to permit the casing 300 to function as a Faraday cage when used to close at least a portion of the body 310 of the casing 300.

The casing 300 may include an antenna sleeve 330 configured to correspond to the coupler 120, the connector 130, and/or the antenna 150. The antenna sleeve 330 may be formed in whole or in part of a same material as the body 310 of the casing 300. The antenna sleeve 330 may be configured in such a manner as to enable operation of the radio 110 when the casing 300 is coupled to the radio 110, for example by coupling to the connector 130 in such a manner as to enable the combined casing 300 and connector 130 to function as a Faraday cage for the radio 110. In various embodiments the grounding wire 220 of the connector 130 may be configured to couple to a conductive surface of the casing 300, for example at the body 310 thereof.

In practice, by combining the electromagnetic wave protection of the casing 300 with the communications capabilities permitted by use of the connector 130, the radio 110 may be permitted to be protected from EMP or other surges while permitting operation of the radio 110 while being protected. Furthermore, the connector 130 in various implementations may be disposable such that even if an EMP is protected by the connector 130 thereby rendering it ineffective for further use, another connector 130 may be used to replace the damaged or used connector 130 to protect components coupled thereto.

Implementations consistent with the present disclosure provide a structure which may functionally mirror a surge protector in various aspects. A connector 130 may connect from one or more radio input-ports of a radio 110 to a microphone and/or antenna itself (see, for example, FIGS. 1, 2A, 2B). The connector 130 may include copper or other conductive wiring that is separated by a fuse 240 and a choke coil 230. The live wire 210 is connected to the grounding wire 220 via one or more MOVs 250. The wiring may be protected by a rigid non-conductive polymer running the entire length from male to female connection ends (see FIGS. 2A, 2B). In the event that an EMP is released, it will blow the fuse 240 and will be redirected down the grounding wire 220. Having the outer portions of the connector 130 being non-conductive may ensure that the energy pulse does not travel further down the antennae/microphone. Although the connector 130 works to protect the radio 110 from the hand-microphones and antennas acting as lightning rods, components of the radio 110 may also require EMP protection. The radio 110 may thus be put into a casing 300 that covers the entire system past the connection between the connector 130 and the hand-microphone/antennae 150 with a material such as an EMF/Aluminum weave cloth to serve as a Faraday Cage (see FIGS. 3A, 3B). In various embodiments a fuse 240 is not required and the connector 130 may be configured to trip a switch instead thereby allowing multiple uses rather than only a single use.

Unlike previous attempts to protect electronic devices against EMPs, implementations consistent with the present disclosure may be used to retrofit an existing radio 110 for protection rather than requiring the design and/or purchase of a new, internally hardened radio 110. This may be done, for example, based at least in part upon the connector 130's capability to couple to existing connectors of the radio 110 and the antenna 150.

Consistent with the present disclosure, provided is a connector apparatus for coupling an electronic device and a conductive element and protecting against an electromagnetic pulse (EMP). The connector apparatus includes a housing having a first end and a second end, the first end coupleable to the electronic device and the second end coupleable to the conductive element, a signal wire extending at least partially through the housing and configured to convey at least one signal between the first end and the second end, a grounding wire coupleable to the signal wire, and at least one suppression element coupleable to at least one of the signal wire and the grounding wire.

The at least one suppression element may be coupled between the signal wire and the grounding wire within the housing. The at least one suppression element comprises at least one metal oxide varistor (MOV). The connector apparatus may include a fuse coupleable to the signal wire within the housing. The connector apparatus may include a choke coil coupleable to the signal wire within the housing. The first end may include a coupler configured to connect to an antenna. The second end may include a coupler configured to connect to an electronic device.

According to further aspects of the present disclosure, provided is a system for protecting against an electromagnetic pulse (EMP). The system may include an electronic device, a conductive element, and a connector apparatus coupleable between the electronic device and the conductive element. The connector apparatus may include a housing having a first end and a second end, the first end coupleable to the electronic device and the second end coupleable to the conductive element, a signal wire extending at least partially through the housing and configured to convey at least one signal between the first end and the second end, a grounding wire coupleable to the signal wire, and at least one suppression element coupleable to at least one of the signal wire and the grounding wire. The system may further include a casing configured to receive at least a portion of the electronic device.

The casing may be a metal mesh material configured to form at least a portion of a Faraday cage around at least a portion of the electronic device. The metal mesh material may be aluminum. The at least one suppression element may be coupled between the signal wire and the grounding wire within the housing. The at least one suppression element may be at least one metal oxide varistor (MOV). The connector apparatus may include a fuse coupleable to the signal wire within the housing. The connector apparatus may include a choke coil coupleable to the signal wire within the housing. The first end may include a coupler configured to connect to an antenna. The second end may include a coupler configured to connect to an electronic device.

According to further aspects of the present disclosure, provided is a method of protecting against an EMP, including receiving a signal at a conductive element coupled to a connector, passing the received signal through a plurality of components of the connector to remove one or more anomalies from the received signal caused by an EMP to form a protected signal, and providing the protected signal to an electronic device coupled to the connector. At least a portion of the electronic device may be placed within at least a portion of a casing such that the at least casing forms a Faraday cage around the at least a portion of the electronic device. Passing the received signal through the plurality of components of the connector may include passing at least a portion of the received signal through a signal wire within a housing of the connector, wherein at least one suppression element coupled to the signal wire provides surge protection to protect the electronic device from an EMP. The at least one suppression element may provide surge protection by conveying the one or more anomalies along the signal wire to a ground wire within the housing of the connector.

To facilitate the understanding of the embodiments described herein, a number of terms are defined below. The terms defined herein have meanings as commonly understood by a person of ordinary skill in the areas relevant to the present disclosure. Terms such as "a," "an," and "the" are not intended to refer to only a singular entity, but rather include the general class of which a specific example may be used for illustration. The terminology herein is used to describe specific embodiments of the present disclosure, but their usage does not delimit the invention, except as set forth in the claims. The phrase "in one embodiment," as used herein does not necessarily refer to the same embodiment, although it may.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A system for protecting against an electromagnetic pulse (EMP), comprising:
   an electronic device;
   a conductive element;
   a connector apparatus coupleable between the electronic device and the conductive element, comprising:
      a housing having a first end and a second end, the first end coupleable to the electronic device and the second end coupleable to the conductive element;
      a signal wire extending at least partially through the housing and configured to convey at least one signal between the first end and the second end;
      a grounding wire coupleable to the signal wire; and
      at least one suppression element coupleable to at least one of the signal wire and the grounding wire; and
   a casing configured to receive the entire electronic device, the casing having one or more flaps removably covering an element of the electronic device such that the element may be accessed by a user.

2. The system of claim 1, wherein the casing comprises a metal mesh material configured to form at least a portion of a Faraday cage around at least a portion of the electronic device.

3. The system of claim 2, wherein the metal mesh material includes aluminum.

4. The system of claim 1, wherein the at least one suppression element is coupled between the signal wire and the grounding wire within the housing.

5. The system of claim 4, wherein the at least one suppression element comprises at least one metal oxide varistor (MOV).

6. The system of claim 1, wherein the connector apparatus further comprises a fuse coupleable to the signal wire within the housing.

7. The system of claim 1, wherein the connector apparatus further comprises a choke coil coupleable to the signal wire within the housing.

8. The system of claim 1, wherein the second end comprises a coupler configured to connect to an antenna.

9. The system of claim 1, wherein the first end comprises a coupler configured to connect to an electronic device.

10. A method of protecting against an electromagnetic pulse (EMP), comprising:
    removing a conductive element from a pre-existing electronic device;
    enclosing the pre-existing electronic device in a casing configured to block electromagnetic signals; coupling a first end of a connector to the pre-existing electronic device
    coupling the conductive element to a second end of the connector;
    receiving a signal at a conductive element coupled to the connector;
    passing the received signal through a plurality of components of the connector to remove one or more anomalies from the received signal caused by the EMP to form a protected signal; and
    providing the protected signal to the pre-existing electronic device coupled to the connector.

11. The method of claim 10, wherein the casing forms a Faraday cage around at least a portion of the pre-existing electronic device.

12. The method of claim 10, wherein the passing the received signal through the plurality of components of the connector includes passing at least a portion of the received signal through a signal wire within a housing of the connector, wherein at least one suppression element coupled to the signal wire provides surge protection to protect the pre-existing electronic device from the EMP.

13. The method of claim 12, wherein the at least one suppression element provides the surge protection by conveying the one or more anomalies along the signal wire to a ground wire within the housing of the connector.

14. The method of claim 12, wherein the at least one suppression element is coupled between the signal wire and a grounding wire within the housing.

15. The method of claim 12, wherein the at least one suppression element comprises at least one metal oxide varistor (MOV).

16. The method of claim 12, wherein the connector includes a fuse coupleable to the signal wire within the housing.

17. The method of claim 12, wherein the connector include a choke coil coupleable to the signal wire within the housing.

18. The method of claim 10, wherein the conductive element includes an antenna.

19. The method of claim 10, wherein the pre-existing electronic device includes a radio.

\* \* \* \* \*